(12) United States Patent
Uihlein et al.

(10) Patent No.: US 9,920,411 B2
(45) Date of Patent: Mar. 20, 2018

(54) DEVICE AND METHOD FOR PARTIALLY MASKING A COMPONENT ZONE OF A COMPONENT

(71) Applicant: MTU Aero Engines AG, Munich (DE)

(72) Inventors: Thomas Uihlein, Dachau (DE); Ralf Stolle, Wolfratshausen (DE); Andreas Kaehny, Emmering (DE); Josef Lachner, Jetzendorf Kemmoden (DE); Heinrich Walter, Friedberg (DE); Michael Strasser, Kleinberghofen (DE); Werner Moosrainer, Sulzemoos/Orthofen (DE); Michael Schober, Munich (DE)

(73) Assignee: MTU Aero Engines AG, Munich (DE)

( * ) Notice: Subject to any disclaimer, the term of this patent is extended or adjusted under 35 U.S.C. 154(b) by 0 days.

(21) Appl. No.: 15/058,858

(22) Filed: Mar. 2, 2016

(65) Prior Publication Data

US 2016/0258046 A1   Sep. 8, 2016

(30) Foreign Application Priority Data

Mar. 3, 2015   (DE) .................. 10 2015 203 729

(51) Int. Cl.
*C23C 4/01* (2016.01)
*C23C 4/02* (2006.01)
(Continued)

(52) U.S. Cl.
CPC .................. *C23C 4/01* (2016.01); *C23C 4/02* (2013.01); *C23C 14/042* (2013.01); *C23C 16/042* (2013.01); *F01D 5/288* (2013.01); *F01D 9/041* (2013.01); *F04D 29/181* (2013.01); *F04D 29/22* (2013.01); *F04D 29/28* (2013.01); *F04D 29/38* (2013.01); *F04D 29/44* (2013.01); *F04D 29/54* (2013.01); *F16J 15/027* (2013.01); *F16J 15/14* (2013.01)

(58) Field of Classification Search
None
See application file for complete search history.

(56) References Cited

U.S. PATENT DOCUMENTS 6,224,673 B1 * 5/2001 Das ........................... C23C 8/04
118/500
6,332,926 B1 * 12/2001 Pfaendtner ............ C23C 16/042
118/504

(Continued)

FOREIGN PATENT DOCUMENTS

| DE | 102008053394 | 4/2010 |
| EP | 2915590 | 9/2015 |
| FR | 2995616 | 3/2014 |

*Primary Examiner* — Joseph A Miller, Jr.
(74) *Attorney, Agent, or Firm* — Davidson, Davidson & Kappel, LLC

(57) ABSTRACT

A method and device for partially masking a component or assembly during a coating process, the device including at least one masking plate for separating a region to be coated from a region to be masked, the masking plate having at least a portion of at least one opening which conforms closely to the contour of the component and is adapted to allow passage of the component therethrough is provided. In masked region, a gap is present along opening, at least one sealing element being disposed at the gap on the side of the masked region.

16 Claims, 3 Drawing Sheets

(51) Int. Cl.

| | |
|---|---|
| *C23C 14/04* | (2006.01) |
| *C23C 16/04* | (2006.01) |
| *F01D 5/28* | (2006.01) |
| *F16J 15/02* | (2006.01) |
| *F16J 15/14* | (2006.01) |
| *F01D 9/04* | (2006.01) |
| *F04D 29/18* | (2006.01) |
| *F04D 29/22* | (2006.01) |
| *F04D 29/28* | (2006.01) |
| *F04D 29/38* | (2006.01) |
| *F04D 29/44* | (2006.01) |
| *F04D 29/54* | (2006.01) |

(56) References Cited

U.S. PATENT DOCUMENTS

| | | | | |
|---|---|---|---|---|
| 2004/0062864 | A1* | 4/2004 | Langley | C23C 10/04 427/250 |
| 2007/0196686 | A1* | 8/2007 | Nagaraj | C23C 10/26 428/678 |
| 2009/0252872 | A1* | 10/2009 | Saylor | C23C 10/04 427/248.1 |
| 2011/0059321 | A1* | 3/2011 | Skoog | C04B 35/18 428/446 |

* cited by examiner

DEVICE AND METHOD FOR PARTIALLY MASKING A COMPONENT ZONE OF A COMPONENT

This claims the benefit of German Patent Application DE102015203729.0, filed Mar. 3, 2015 and hereby incorporated by reference herein.

The present invention relates to a device for partially masking a component to be coated, as well as to a corresponding method.

BACKGROUND

Different component portions of, for example, gas turbine blades require different types and thicknesses of protective coatings, and some portions require that there be no coating thereon since, otherwise, the strength of the component is dramatically reduced. The application of the different types and thicknesses of protective coatings in some regions, and the prevention of coating deposition in other regions, while using the most efficient coating techniques, can pose difficult problems for those components which are newly manufactured or repaired, and may have existing coatings thereon and/or may need new coatings applied. In many cases, it is difficult to achieve the desired combination of protective coatings and uncoated surfaces.

Furthermore, due to high local mechanical loads, airfoils may be coated only in sub-regions where the limited extensibility of the erosion-protection coating does not present any mechanical risk. Therefore, a local masking device is needed which is to be adapted to the particular airfoil. The increasing complexity of 3D airfoil design and the difficult accessibility encountered in blisks increase the complexity required of the masks. In particular, the tolerances defined for airfoil coatings are often very narrow. Not only must the layer thicknesses be correct, but the coatings may be applied only where permitted.

Such a masking device is disclosed, for example, in DE 10 2008 053 394 A. A masking plate is disposed around the component to be processed. A gap is present between the component and the masking plate. Disposed in the gap is a felt or a brush seal that adapts to the contour of the component without damaging it.

SUMMARY OF THE INVENTION

In this connection, it is in particular disadvantageous that the metal felt is permeable to the vapor phase of the metal atoms and ions to be deposited, and that nevertheless an uncontrolled atomic deposition zone is still formed on the surface of the airfoil in the near region that is not to be coated. This atomic coating zone must be laboriously mechanically finished subsequent to coating, which is time- and cost-intensive. Furthermore, the component may be damaged by the mechanical finishing process.

It is an object of the present invention to provide a method and device which will overcome the above-described disadvantages.

The present invention provides a device for partially masking a component or assembly during a coating process, the device including at least one masking plate for separating a region to be coated from a region to be masked, the masking plate having at least a portion of at least one opening which conforms closely to the contour of the component and is adapted to allow passage of the component therethrough.

In masked region (12), a gap ($R_S$) is present along opening (14), at least one sealing element (28, 30; 46) being disposed at the gap on the side of the masked region. "On the side of the masked region" means that the sealing element is not located in the gap or opening, but is placed in front of the opening (i.e., the resulting gap) from one side, namely the masked side, which is not to be coated.

Thus, the sealing element may be disposed directly at the opening behind the masking plate. Accordingly, the sealing element is not located directly in the opening. Thus, "behind the masking plate" refers to the region to be masked; i.e., the masked region. Preferably, the opening is shaped to conform closely to the contour of the component. An opening closely conforming to the contour is obtained, for example, when the clearance between the opening and the component is constant over the circumference; i.e., the opening follows the contour of the component.

The device advantageously avoids unwanted hard coating transitions, so that the layer thickness gradually decreases from the coated region toward the uncoated region and is not built up in a step-like manner, since such coating steps promote the formation and propagation of cracks.

In another advantageous embodiment of the present invention, the gap between the opening and the component is shaped and dimensioned such that the sealing element does not fit through the gap. This is advantageous, especially since the sealing element, such as vibratory polishing stones, grinding balls, or the like, is prevented from trickling into the gap and unintentionally masking part of the region to the coated. In the case of spherical sealing elements, for example, marginal gap $R_S$ is smaller than ball diameter d.

In another advantageous embodiment of the present invention, the sealing element is spherical, cylindrical, pyramidal, conical, cushion-shaped and/or ring-shaped. The pyramidal sealing elements may have a triangular or quadrangular base. Generally, it holds that the base of the individual sealing elements does not have to extend perpendicularly to the height. Thus, for example, the ends of the cylindrical sealing elements may be cut at an angle with respect to the cylinder centerline. The shape is suitably selected according to the coating type and result.

In another advantageous embodiment of the present invention, the sealing element is hollow. This sealing element is preferably gas-tight, so that the air enclosed in the sealing element may expand under vacuum. For example, if a single ring-shaped sealing element is placed around the component, then this sealing element will expand under vacuum and engage against the surface of the component without damaging it. Alternatively, or in combination therewith, the sealing elements may be cushion-shaped. These hollow cushions are then arranged around the component. Moreover, the sealing elements may be, for example, hollow balls which are filled around the component and held in place. Due to the vacuum, the hollow balls can expand and reduce the interstices between the balls, thereby preventing the coating material from unintentionally getting past the balls.

In another advantageous embodiment of the present invention, the thickness of the shell of the hollow sealing element is between 100 µm and 1 mm. Preferably, metal is used as the shell material because metal is capable of expansion and is temperature-resistant. The shell thickness influences the expansion of the sealing element under vacuum.

In another advantageous embodiment of the present invention, the sealing element is made of metal, ceramic and/or plastic. The sealing element must be capable of withstanding temperatures from 300 to 450° C. The ceramic used is preferably aluminum oxide in combination with silicon oxide, typically mixed in a ratio of 90 vol % of Al to 10 vol % of $SiO_2$.

In another advantageous embodiment of the present invention, the size of the sealing element is between 1.0 and 10 mm. Balls having a diameter of from 1.2 to 1.3 mm are preferably used as sealing elements. Other balls having a diameter of from 2.5 to 3.5 [mm] may be used alternatively or in combination. It is also conceivable to use larger balls, depending on the gap.

In another advantageous embodiment of the present invention, the device has a retaining element disposed around the sealing element, the retaining element being located in the masked region. This is advantageous, especially when bulk material, such as vibratory polishing stones or grinding balls, are used, because the sealing elements can be arranged around the component in a targeted manner. This allows the number of sealing elements used to be kept to a minimum. In the case of a hollow sealing element or a plurality of hollow sealing elements, the sealing elements can press against the retaining element as they expand, thereby increasing the sealing pressure at the component, so that there the gap between the masking plate and the component is better sealed.

In another advantageous embodiment of the present invention, at least two masking plates form at least one opening for the component. This has the advantage that the component does not need to be inserted through the opening of the masking plate. Instead, in the case of a blisk (bladed disk), the masking plates can be arranged between the blades, i.e. in the blade gaps. In this connection, at the two opposite edges of the masking plate each may have a cutout defining half of an opening.

Thus, two adjacent masking plates together form an opening for the component at their abutting edges.

The present invention further relates to a method for partially masking a component zone of a component. Initially, component (16) is placed into an opening (14) of at least one masking plate (4, 4', 4") that separates a region (26) to be coated from a region (24) to be masked, the opening conforming closely to the contour of the component, so that the opening has a minimal gap ($R_S$). Then, at least one sealing element (28, 30; 46) is placed in the masked region near opening (14) such that gap ($R_S$); i.e., the opening, is closed on one side. Then, region (26) to be coated is coated.

In another advantageous embodiment of the present invention, coating is effected by physical vapor deposition (PVD), chemical vapor deposition (CVD) and/or by thermal spraying.

In another advantageous embodiment of the present invention, a retaining element is disposed around the sealing element prior to coating.

In another advantageous embodiment of the present invention, a vacuum is created prior to coating. This allows hollow and gas-tight sealing elements to expand under such conditions.

BRIEF DESCRIPTION OF THE DRAWINGS

Preferred exemplary embodiments of the present invention will now be described in more detail with reference to the schematic drawings, in which.

DETAILED DESCRIPTION

Figure 1:
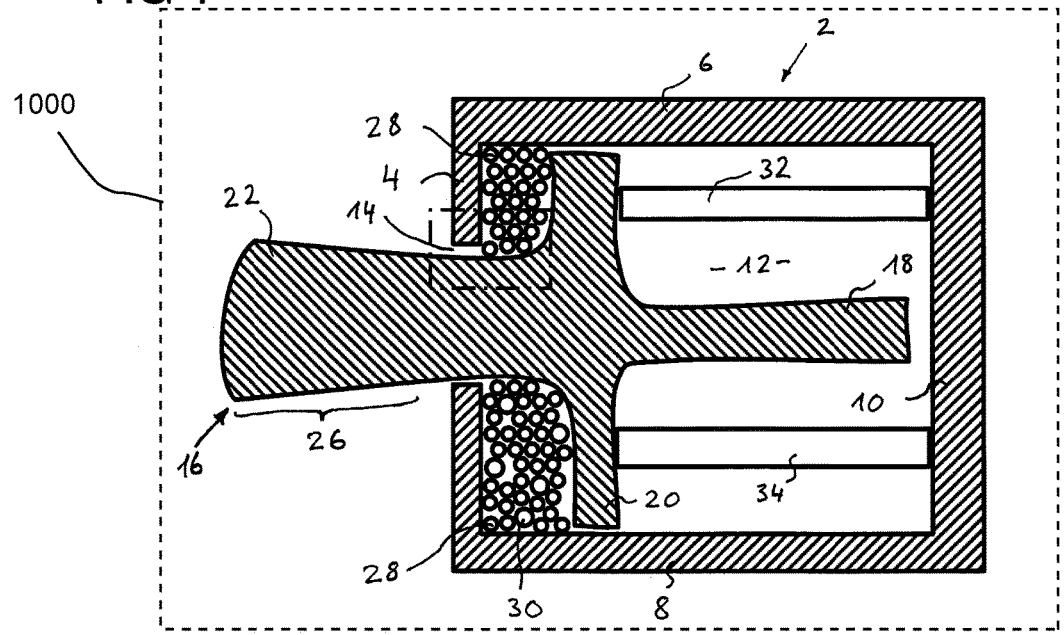
FIG. 1 is a cross section through a device according to the present invention.

FIG. 1 shows a cross section through a masking container 2 having a masking plate 4, two side walls 6 and 8 and a bottom plate 10 and enclosing a cavity 12. An opening 14 is formed in masking plate 4. A portion of component 16 is disposed within cavity 12. The component shown here is in particular a rotor blade or stator vane 16. Thus, blade root 18 and inner shroud 20, and inner portion 24 of airfoil 22, are disposed in cavity 12. Airfoil 22 extends through opening 14 such that upper portion 26 of airfoil 22 is disposed outside of cavity 12. Cavity 12 represents what is referred to as the not-to-be-coated region. In FIG. 1, this is the region to the right of masking plate 4. Located to the left of masking plate 4 and in opening 14 is what is referred to as the to-be-coated region of component 16.

In a first embodiment, balls 28 of equal diameter are disposed as sealing elements above airfoil 22 between masking plate 4 (to the right thereof), radially lower portion 24 of airfoil 22 (the right region of the airfoil in FIG. 1), inner shroud 20 and a portion of side wall 6. In FIG. 1, in a second embodiment, balls 28 and 30 of different diameters are disposed as sealing elements below airfoil 22 between masking plate 4 (to the right thereof), radially lower portion 24 of airfoil 22, inner shroud 20 and a portion of side wall 8. These two embodiments may be used alternatively or in combination, as in FIG. 1.

In order to prevent sealing elements 28 and 30 from displacing rotor blade 16 within masking container 2, two retaining elements 32 and 34, for example, are disposed in cavity 12 to press here against the underside of inner shroud 20 and bottom plate 10 and hold rotor blade 16 in position in masking container 2.

Figure 2:
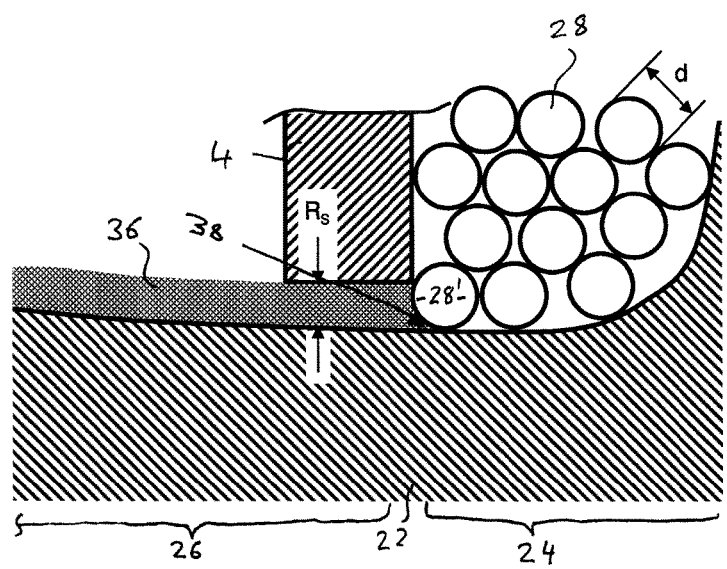
FIG. 2 is an enlarged view of the dot-dashed portion of FIG. 1.

FIG. 2 shows an enlarged view of the dot-dashed detail of FIG. 1. A portion of masking plate 4 is visible in the upper portion of FIG. 2. A portion of inner shroud 20 of blade 16 is shown to the right thereof. Disposed therebetween are ball-shaped sealing elements 28 and 28', which rest on radially lower portion 24 of airfoil 22. A gap or marginal gap $R_S$ is present between the surface of airfoil 22 and masking plate 4. A ball 28' is disposed against masking plate 4 and lower portion 24 of airfoil 22 directly at the end of opening 14; i.e., at marginal gap $R_S$. It should be noted that the balls are randomly positioned by the filling process. Therefore, the representation in FIG. 2 should be understood to be merely exemplary. During the coating process, a coating 36 is formed on the surface of airfoil 22, the coating extending up to ball 28'. Thus, coating is provided with a transition wedge 38 as a termination. The layer thickness decreases already in the region around masking plate 4.

Figure 3:
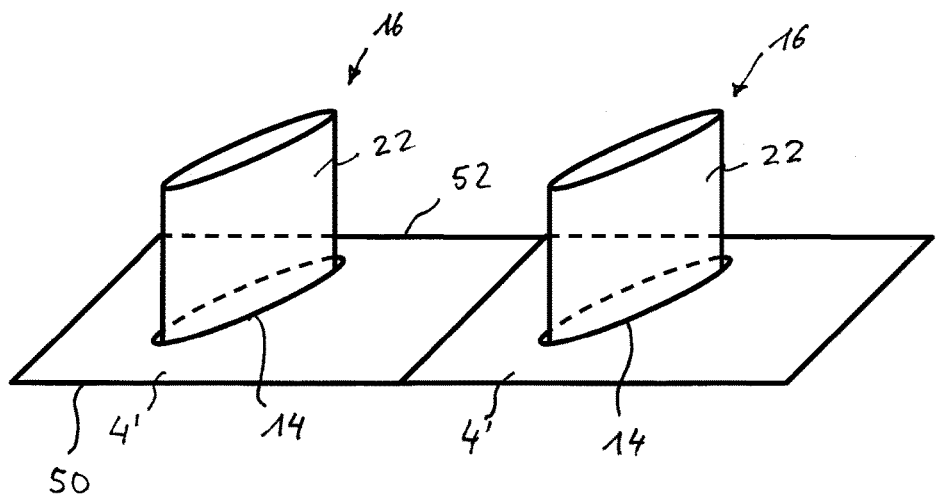
FIGS. 3, 4 are oblique views showing a plurality of masking plates.

FIG. 3 shows an oblique view of two blades 16 which are masked by two masking plates 4'. Each of masking plates 4' has an opening 14 through which is passed the corresponding airfoil 22.

Figure 4:
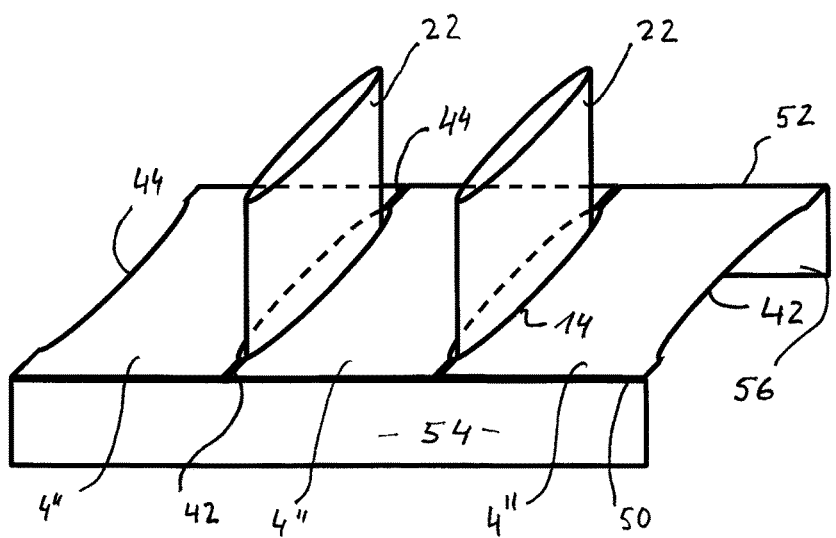

FIG. 4 shows an oblique view of two blades 16 which are masked by three masking plates 4". Each masking plate 4" has a (here) right edge 42 and an opposite, (here) left edge 44, the two edges each forming a portion of opening 14. Thus, in FIG. 4, right edge 42 of left masking plate 4" and left edge 44 of central masking plate 4" together form left opening 14 in which left airfoil 22 is located. This embodiment has the advantage that, in the case of a blisk, masking plates 4" can be easily positioned between airfoils 22 and suitably secured. Although not shown in the figure, it would also be possible to provide an additional separation, for example, along sealing cushion 46 (see FIG. 5), so as to provide here an additional separation, and thus mask, in the case of more complex 3D geometries.

Figure 5:
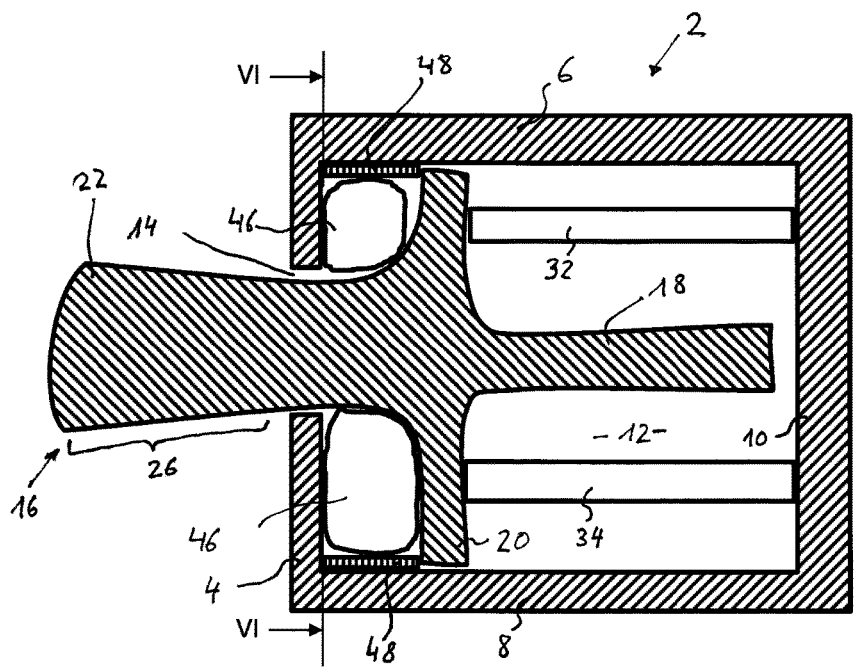
FIG. 5 is a cross section through an alternative device according to the present invention.
Figure 6:
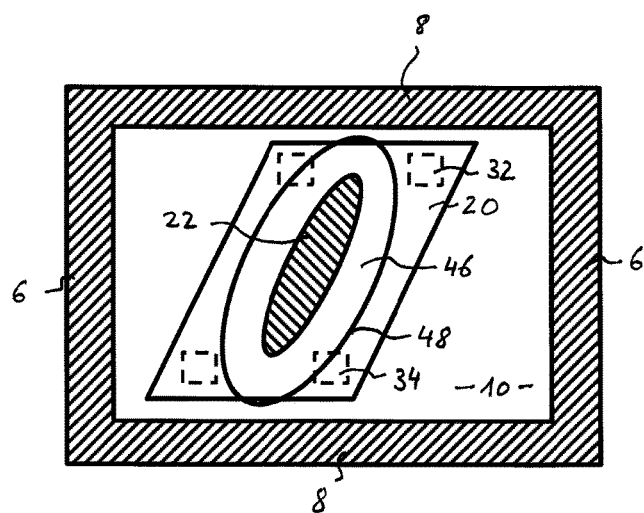
FIG. 6 is a cross section taken along line IV-IV of FIG. 5.

FIG. 5 shows a section through a third embodiment of a device according to the present invention. FIG. 6 shows a cross section taken along line IV-IV of FIG. 5. In the following, only the differences from the first two embodiments of FIG. 1 will be described.

In this third embodiment, a ring-shaped hollow sealing cushion 46 is disposed as a sealing element above and below airfoil 22 between masking plate 4 (to the right thereof in FIG. 5), lower portion 24 of airfoil 22, inner shroud 20 and a portion of side walls 6 and 8. This sealing cushion 46 has a metallic shell to withstand the temperatures occurring during the coating process. A retaining element 48 may be disposed around sealing cushion 46 such that the sealing cushion conforms closely to the shape of airfoil 22. In particular, retaining element 48 assists the sealing cushion in creating pressure on airfoil 22, since sealing cushion 46 is held in place at its outer periphery by the retaining element and, therefore, can only escape inwardly. As a result, marginal gap $R_S$ is sealed on the side of cavity 12.

Retaining element 48 may also be used in two embodiments of FIG. 1. Instead of solid balls, there may be used hollow balls which, such as sealing cushion 46, expand under vacuum.

The masking containers shown in FIGS. 1, 5 and 6 are preferably suitable for individual blades. However, if a plurality of blades of a blisk are to be coated, then only masking plates 4' or 4" are used. In order to laterally bound lower portion 24 of airfoil 22, initially, a forward (segmented) ring or disk 54 (see FIG. 4) attached to the forward edges 50 (see FIG. 3) of masking plates 4". The region between masking plates 4', respectively masking plates 4", and inner shrouds 20 is filled with a plurality of sealing elements (e.g., balls 28). Then, the rearward (segmented) ring or disk 56 is attached to rearward edges 52. The masked blisk is then placed into the coating chamber 1000, shown schematically in FIG. 1. In this chamber, a vacuum is created, and then the exposed surfaces of the blisk airfoils are coated.

It is generally also preferred to attach the two disks 54, 56, to fill the cavity, and to subsequently mount masking plates 4', 4".

LIST OF REFERENCE NUMERALS

2 masking container
4; 4'; 4" masking plate
6 side wall
8 side wall
10 bottom plate
12 cavity
14 opening
16 component (rotor blade)
18 blade root
20 inner shroud
22 airfoil
24 lower portion of the airfoil
26 upper portion of the airfoil
28 ball of one diameter
30 ball of another diameter
32 retaining element
34 retaining element
36 coating
38 transition wedge
42 right edge
44 left edge
46 sealing cushion
48 retaining element
50 forward edge
52 rearward edge
54 forward ring or disk
56 rearward ring or disk
1000 coating chamber
d ball diameter
$R_S$ marginal gap

What is claimed is:

1. A device for partially masking a component or assembly located in a coating vacuum chamber during a coating process, the device comprising:
    at least one masking plate for separating a region to be coated from a region to be masked, the masking plate having at least a portion of at least one opening conforming to a contour of the component and is adapted to allow passage of the component therethrough;
    a gap being present along the opening; and
    at least one seal element being disposed at the gap on a side of the masked region, the seal element sealing the opening with respect to the coating vacuum chamber when a vacuum is present in the coating vacuum chamber;
    wherein the seal element is hollow.

2. The device as recited in claim 1 wherein the gap between the opening and the component is shaped and dimensioned such that the seal element does not fit through the gap.

3. The device as recited in claim 1 wherein the thickness of a shell of the hollow seal element is between 100 μm and 1 mm.

4. The device as recited in claim 1 wherein the seal element is made of metal, ceramic or plastic.

5. The device as recited in claim 1 wherein the size of the seal element is between 1.0 and 10 mm.

6. The device as recited in claim 1 further comprising a retaining element disposed around the seal element, the retaining element being located in the masked region.

7. A device for partially masking a component or assembly located in a coating vacuum chamber during a coating process, the device comprising:
    at least one masking plate for separating a region to be coated from a region to be masked, the masking plate having at least a portion of at least one opening conforming to a contour of the component and is adapted to allow passage of the component therethrough;
    a gap being present along the opening; and
    at least one seal element being disposed at the gap on a side of the masked region, the seal element sealing the opening with respect to the coating vacuum chamber when a vacuum is present in the coating vacuum chamber;
    wherein at least one masking plate includes two masking plates form the opening for the component.

8. The device as recited in claim 1 wherein the seal element is expandable.

9. A device for partially masking a component or assembly during a coating process, the device comprising:

at least one masking plate for separating a region to be coated from a region to be masked, the masking plate having at least a portion of at least one opening conforming to a contour of the component and is adapted to allow passage of the component therethrough;

a gap being present along the opening; and at least one seal element being disposed at the gap on a side of the masked region, wherein the at least one seal element includes a hollow sealing cushion or hollow balls.

10. The device as recited in claim 9 wherein the gap between the opening and the component is shaped and dimensioned such that the seal element does not fit through the gap.

11. The device as recited in claim 9 wherein the thickness of a shell of the hollow seal element is between 100 μm and 1 mm.

12. The device as recited in claim 9 wherein the seal element is made of metal, ceramic or plastic.

13. The device as recited in claim 9 wherein the size of the seal element is between 1.0 and 10 mm.

14. The device as recited in claim 9 further comprising a retaining element disposed around the seal element, the retaining element being located in the masked region.

15. The device as recited in claim 9 wherein at least one masking plate includes two masking plates form the opening for the component.

16. The device as recited in claim 9 wherein the seal element is expandable under vacuum pressure.

* * * * *